United States Patent
McNulty et al.

[11] Patent Number: 6,124,714
[45] Date of Patent: Sep. 26, 2000

[54] LIGHTNING AND SURGE ARRESTER TEST APPARATUS AND METHOD

[75] Inventors: William J. McNulty, River Forest; Mark R. Hoffman, Lake Forest, both of Ill.

[73] Assignee: HD Electric Company, Waukegan, Ill.

[21] Appl. No.: 09/036,772

[22] Filed: Mar. 9, 1998

[51] Int. Cl.[7] ................................................. G01R 31/02
[52] U.S. Cl. .......................... 324/418; 324/210; 324/546
[58] Field of Search .............................. 324/552, 72, 415, 324/424, 547, 551, 546

[56] References Cited

U.S. PATENT DOCUMENTS

| | | |
|---|---|---|
| 3,569,829 | 3/1971 | Griffey . |
| 4,075,549 | 2/1978 | Woodward .................................. 324/28 |
| 4,157,496 | 6/1979 | St-Jean . |
| 4,259,666 | 3/1981 | Takahaski et al. . |
| 4,336,494 | 6/1982 | Shindo et al. . |
| 4,338,648 | 7/1982 | Subbarao ................................. 361/127 |
| 4,507,701 | 3/1985 | Fujiwara et al. . |
| 4,543,523 | 9/1985 | Moran . |
| 4,758,792 | 7/1988 | Polonis et al. ........................... 324/552 |
| 4,866,393 | 9/1989 | Iwai et al. . |
| 4,929,900 | 5/1990 | Hastings et al. . |
| 4,998,076 | 3/1991 | Von Bokern . |
| 5,087,885 | 2/1992 | Bergstrom . |
| 5,136,234 | 8/1992 | Shaw ........................................... 324/72 |
| 5,172,067 | 12/1992 | Hoffmann ................................ 324/713 |
| 5,514,964 | 5/1996 | Benesh et al. . |
| 5,621,309 | 4/1997 | Feldman . |

OTHER PUBLICATIONS

HD Electric Brochure 1992 (no month available).

*Primary Examiner*—Safet Metjahic
*Assistant Examiner*—Vincent Q. Nguyen
*Attorney, Agent, or Firm*—Seyfarth Shaw

[57] ABSTRACT

A lightning arrester tester includes two tubular poles respectively carrying probe terminals, one probe terminal being connected in series through a high-voltage rectifier and high-resistance circuit disposed within the pole to one terminal of a DC microammeter mounted on the outside of the one pole, the other probe terminal being connected through a high-resistance circuit housed within the second pole to the other meter terminal. A diode is connected in parallel with the meter to protect the meter from high leakage currents. In use, the probe terminals are respectively connected to a high-voltage power transmission or distribution line and one terminal of an arrester, the other terminal of which is grounded or, alternatively, to ground and to one terminal of an arrester, the other terminal of which is connected to a high-voltage power transmission or distribution line. The meter displays DC leakage current through the arrester.

14 Claims, 2 Drawing Sheets

6,124,714

LIGHTNING AND SURGE ARRESTER TEST APPARATUS AND METHOD

BACKGROUND OF THE INVENTION

The invention relates to apparatus for testing lightning and surge arresters and, in particular, to portable apparatus for field testing of such arresters.

Lightning and surge arresters, hereinafter referred to as "lightning arresters," are designed to protect a power transmission or distribution system by shunting to ground high voltage surges, such as those caused by lightning. Arresters are subjected to stresses of very high voltages and currents and can be damaged by lightning and can deteriorate over time. Eventually, lightning arresters can fail, and when they do it is usually a violent failure, resulting in destruction of the arrester, as by explosion.

Arresters are often installed on an overhead or underground power transmission or distribution system while the system is live. Connecting a weak or damaged arrester to a live line can result in an immediate or eventual catastrophic failure. If the failure is immediate, the line personnel are endangered by the resulting system fault. If the failure is eventual, another outage is caused, peripheral equipment is damaged and the service crew must repair the damage and restore power.

Known lightning arrester testers are typically stationary, laboratory-based equipment, requiring highly skilled technical people to operate. While these laboratory systems provide sensitive tests that can find even very subtle types of arrester damage, they are expensive and inconvenient and do not permit the testing of arresters in the field.

It is also known to provide lightning arresters with built-in monitoring circuits to provide an indication when leakage currents reach an unacceptably high level. But this requires a specialized arrester design and is of no assistance in testing standard arresters without the built-in monitoring circuitry.

SUMMARY OF THE INVENTION

It is a general object of the invention to provide an improved lightning arrester tester, which avoids the disadvantages of prior test systems while affording additional structural and operating advantages.

An important feature of the invention is the provision of a lightning arrester tester which is suitable for field use.

In connection with the foregoing feature, a further feature of the invention is the provision of a relatively portable and light-weight system which does not require any built-in power source.

Another feature of the invention is the provision of an improved method for testing lightning arresters.

Certain ones of these and other features of the invention may be attained by providing a tester for a lightning arrester connected to power transmission or distribution equipment comprising: a housing assembly including at least one tubular pole and first and second probe terminals, a high-voltage rectifier permanently disposed within the at least one pole and connected to the first probe terminal, and a microammeter carried by the at least one pole and connected between the rectifier and the second probe terminal.

Other features of the invention may be attained by providing a method of testing a lightning arrester connected between a high-voltage power transmission or distribution line and ground, the method comprising the steps of: rectifying the transmission or distribution line voltage to a high DC voltage, applying the rectified high DC voltage across the arrester, and measuring the DC leakage current through the arrester.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 3:
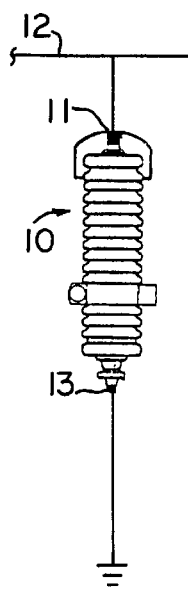
FIG. 3 is a side elevational view of a lightning arrester illustrated connected between a power transmission or distribution line and ground.

Referring to FIG. 3, there is illustrated a lightning arrester of known prior art construction, illustrated in use for protecting a high-voltage overhead power transmission or distribution line. More specifically, the arrester 10 has a terminal 11 connected to the power line 12, and a terminal 13 connected to ground. The power line 12 may, for example, be a phase wire of a three-phase, high-voltage distribution line, such as a 15-KV line although it will be appreciated that the invention is usable with arresters designed for other voltage levels and single-phase systems.

Figure 1:
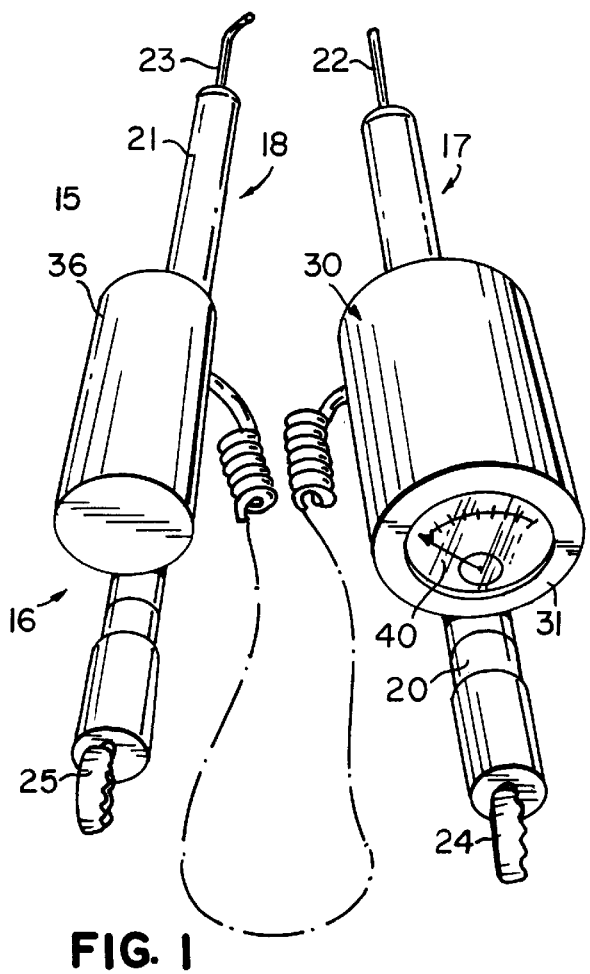
FIG. 1 is a perspective view of a lightning arrester tester in accordance with the present invention.
Figure 2:
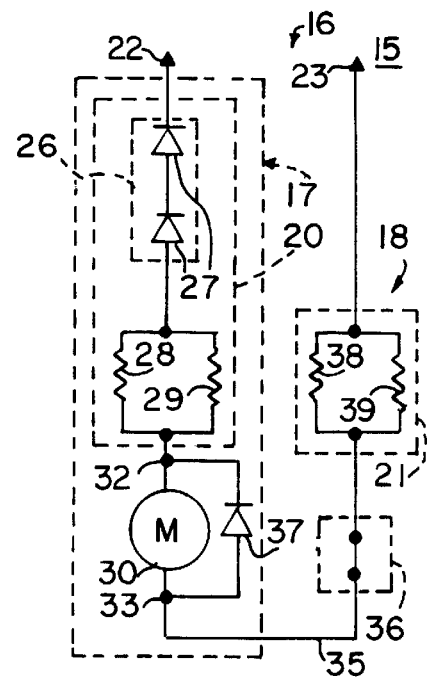
FIG. 2 is a schematic circuit diagram of the tester of FIG. 1.
Figure 6:
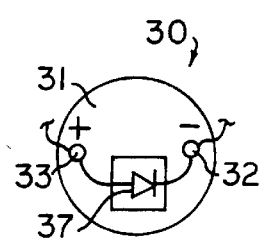
FIG. 6 is a rear elevational view of the microammeter of the tester of FIG. 1.

Referring to FIGS. 1, 2 and 6, there is illustrated a lightning arrester tester 15, constructed in accordance with and embodying the features of the present invention. The tester 15 has a housing assembly 16, which includes two pole assemblies 17 and 18. More specifically, the pole assemblies 17 and 18, respectively, include elongated, tubular probe poles 20 and 21, respectively provided at an end thereof with probe terminals 22 and 23, which may be formed of a suitable electrically conductive metal, such as brass. The poles 20 and 21 are, respectively, provided at their opposite ends with spline connectors 24 and 25 to facilitate connection to associated tools, such as "hot stick" extensions or the like, to extend the reach of the poles for certain overhead applications. The above-described features of the housing assembly 16 are of known construction.

Housed within the probe pole 20 is a high-voltage rectifier 26 including two series-connected diodes 27 with the cathode of one diode 27 connected to the probe terminal 22. The anode of the other diode 27 is connected to one terminal of a pair of parallel-connected resistors 28 and 29, each having a very high resistance, preferably about 6.5 megohms. The other terminal of the resistor pair 28, 29 is connected to a microammeter 30, which is disposed within a housing 31 mounted on the outside of the probe pole 20 (FIG. 1). More particularly, the resistor pair 28, 29 is connected to a terminal 32 of the meter 30, the other terminal 33 of which is connected through a cable 35 to a junction box 36 mounted on the outside of the other probe pole 21. A diode 37 is connected across the terminals 32 and 33 (see FIG. 6). The cable 35 is connected to one terminal of a pair of parallel-connected, high-resistance (e.g. 6.5 megohms) resistors 38 and 39 disposed within the probe pole 21, the other terminal of which is connected to the probe terminal 23 (FIG. 2). The poles 20 and 21 may be filled with an epoxy encapsulating compound. Preferably, the meter 30 has a display 40, which is calibrated to measure leakage current and directly displays the current value, an indication of whether or not the leakage current is above an acceptable range or both.

The method of the present invention for testing the lightning arrester 10 includes applying to the arrester a high DC voltage and then monitoring DC leakage current through the arrester 10. It is a significant aspect of the invention, that the tester 10 does not require an internal power source but, rather, utilizes the available power on a power transmission or distribution line to perform the test. More specifically, in accordance with the present invention, the high AC voltage on a power transmission or distribution line is rectified and then the high rectified DC voltage is applied through current-limiting resistors across the arrester 10 to be tested, the resulting leakage current being monitored by a series-connected microammeter.

The method of the invention is performed using the tester 15. Preferably, before and after testing an arrester 10, the tester 15 itself should be tested. This can be done by simply connecting one of the probe terminals 22, 23 to an energized power line, and connecting the other terminal to ground. The meter 30 should read at least full scale.

If the tester 15 is operating properly, it is then used to test an arrester 10. If the arrester 10 is one which is about to be installed, the user simply connects one terminal of the arrester to ground, and connects the other terminal to one of the probe terminals 22, 23 and connects the other probe terminal to a power line 12. The AC voltage is rectified by the rectifier 26 and limited by the resistors 28, 29 and 38, 39, the leakage current being measured by the meter 30. The diode 37 simply protects the meter 30 from excessive leakage currents.

Figure 4:
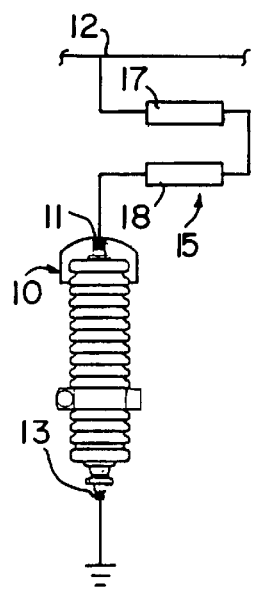
FIG. 4 is a view similar to FIG. 3, illustrating one application of the tester of FIGS. 1 and 2 in testing the lightning arrester.

Referring to FIG. 4, if it is desired to test an arrester 10 which is already installed in use for protecting a power transmission or distribution line 12, the connection between the arrester terminal 11 and the power line 12 may be opened and the tester 15 inserted in series with the arrester 10, such as by connecting the pole assembly 17 to the power line 12 and the pole assembly 18 to the arrester terminal 11.

Figure 5:
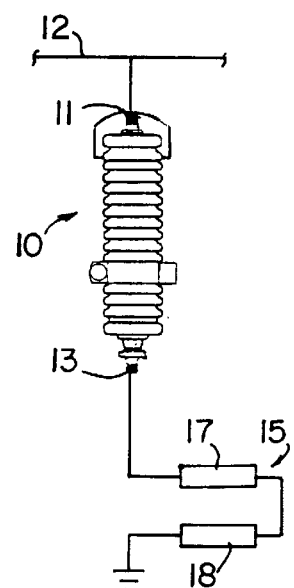
FIG. 5 is a view similar to FIG. 4, illustrating another application of the tester of FIGS. 1 and 2.

Alternatively, referring to FIG. 5, the test could be performed by connecting the tester 15 in series between the arrester terminal 13 and ground. It will be appreciated that, in either of the arrangements of FIGS. 4 and 5, the pole assemblies 17 and 18 could be reversed in the interconnection and the system would operate in essentially the same manner. Preferably, arresters with leakage currents greater than 10 microamps are classified as high leakage and indicate a possibly defective arrester. Such arresters, if in service, should be replaced and, if about to be installed, should not be energized.

Figure 7:
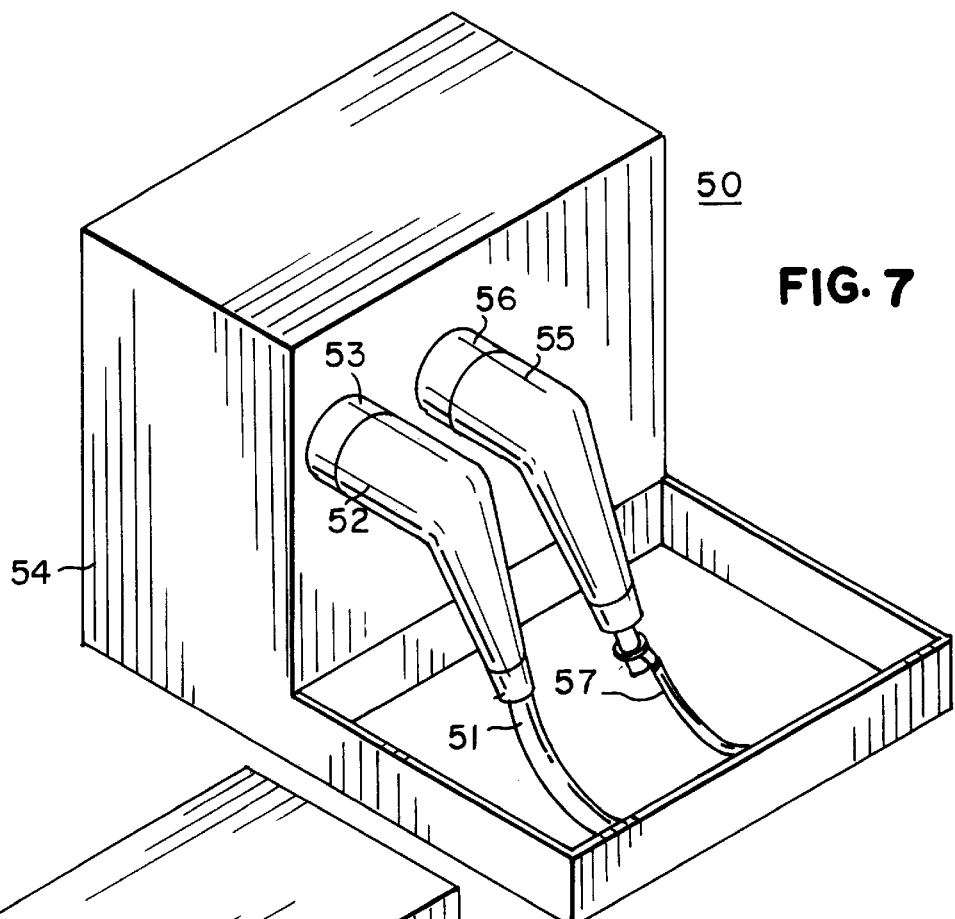
FIG. 7 is a perspective view of a transformer connection of an underground power distribution system with an elbow-type lightning arrester.
Figure 8:
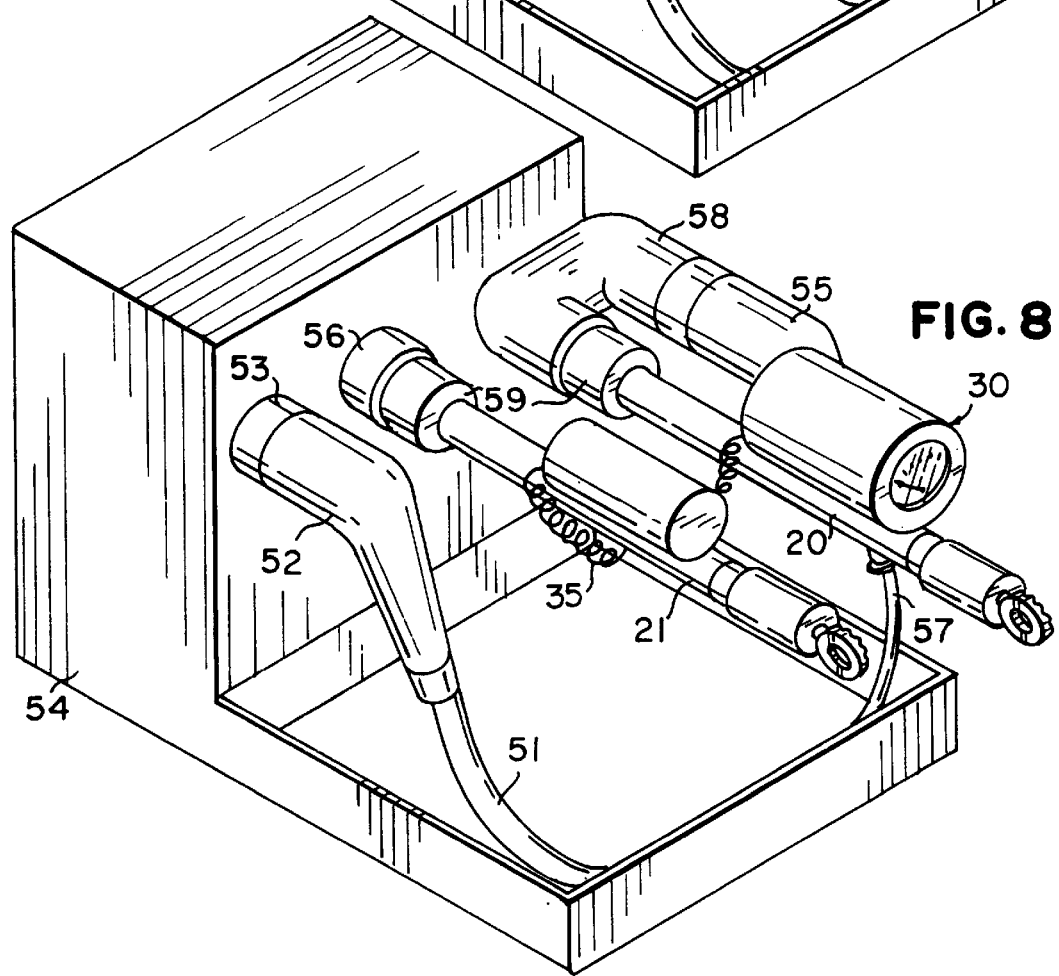
FIG. 8 is a view similar to FIG. 7, illustrating the use of the tester of the present invention for testing the arrester of FIG. 7.

The tester 15 can also be used for testing arresters in an underground power distribution system 50, of the type illustrated in FIG. 7, in which an underground power cable 51 is coupled through an elbow connector 52 to a bushing 53 of a transformer 54. An elbow-type arrester 55 has one terminal thereof plugged into a bushing 56 of the transformer 54, and has its other terminal connected through a ground lead 57 to the system ground rod. Referring to FIG. 8, in order to test the arrester 55, it is disconnected from the bushing 56 and plugged into one end of a feed-thru 58. The tester probe pole 20 is then connected to the other end of the feed-thru 58 via an adapter 59, while the probe pole 21 of tester 15 is plugged into the bushing 56 via another adapter 59, which may be of the type sold by HD Electric Company under the designation ASP-15 or ASP-25, for 15-KV and 25-KV installations, respectively.

The tester 15 tests the arrester 10 or 55 with a high DC voltage which is equal to the peak AC voltage in the power line. For example, on a 15-KV system with line-to-ground voltage of 7200 volts, the arrester tester DC test voltage is about 10-KV.

It is significant that, because of the current limiting by the resistors 28, 29, 38 and 39, an arrester 10 or 55 tested with the tester 15 cannot be damaged by the test procedure. The tester 15 improves overall system reliability by testing and removing from a system those arresters that are most likely to fail within a short time. When overhead arresters fail, they generally blow themselves clear of the system and leave the system phase or phases unprotected from lightning. When underground arresters fail, they generally cause a system outage and damage peripheral equipment.

The tester 15 is designed to provide a quick test on arresters in the field using available high voltage. While it is not as sensitive as a laboratory test, it will warn the user of a damaged arrester that could fail immediately upon energizing.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A passive tester for a lightning arrester connected to power transmission or distribution equipment comprising:
a housing assembly including at least one tubular pole and first and second probe terminals, a high-voltage rectifier permanently disposed within said at least one pole and connected to said first probe terminal, and
a DC microammeter carried by said at least one pole and connected in series between said rectifier and said second probe terminal.

2. The tester of claim 1, and further comprising a diode connected in parallel with said microammeter.

3. The tester of claim 1, and further comprising a second tubular pole, said probe terminals being respectively carried by said poles.

4. The tester of claim 3, and further comprising two high-resistance circuits respectively disposed within said poles and connected in series with said rectifier and said microammeter.

5. The tester of claim 1, and further comprising a high-resistance circuit disposed within said housing assembly and connected in series with said rectifier and said microammeter.

6. The tester of claim 1, wherein said microammeter is calibrated for displaying leakage current through the lightning arrester being tested.

7. A method of testing a lightning arrester connected between a high-voltage power transmission or distribution line and ground, said method comprising the steps of: rectifying the line voltage to a high DC voltage, applying the rectified high DC voltage across the arrester, and measuring the DC leakage current through the arrester.

8. The method of claim 7, wherein the rectifying, applying and measuring steps are effected by connecting a high-voltage rectifier and a DC microammeter in series with the arrester.

9. The method of claim 8, wherein the rectifier and the meter are connected between the arrester and the associated power line.

10. The method of claim 8, wherein the rectifier and the microammeter are connected between the arrester and ground.

11. The method of claim 8, and further comprising the step of connecting a high-resistance circuit in series with the rectifier and the microammeter.

12. The method of claim 7, wherein the method is effected by mounting rectifying and measuring apparatus on two electrically interconnected, elongated probe poles, respectively having probe terminals between which the rectifying and measuring apparatus is connected in series, and connecting the probe terminals respectively to the arrester and either the power line or ground.

13. A method of testing a lightning arrester connected between a high-voltage power line and ground, comprising connecting a high-voltage rectifier and a DC ammeter in series with the arrester between the power line and ground.

14. The method of claim 13, and further comprising the step of connecting a high resistance in series with the rectifier and the ammeter.

* * * * *